United States Patent [19]

Heeren

[11] 3,903,431

[45] Sept. 2, 1975

[54] CLOCKED DYNAMIC INVERTER

[75] Inventor: Richard H. Heeren, Palatine, Ill.

[73] Assignee: Teletype Corporation, Skokie, Ill.

[22] Filed: Dec. 28, 1973

[21] Appl. No.: 429,324

[52] U.S. Cl. ................ 307/205; 307/214; 307/246; 307/269

[51] Int. Cl.² ..................... H03K 19/08; H03K 19/40; H03K 17/60; H03K 5/13

[58] Field of Search ........... 307/205, 214, 246, 269, 307/270, 251, 304

[56] References Cited

UNITED STATES PATENTS

| | | | |
|---|---|---|---|
| 3,619,670 | 11/1971 | Heimbigner | 307/251 X |
| 3,626,210 | 12/1971 | Spence | 307/205 X |
| 3,629,618 | 12/1971 | Fujimoto | 307/251 X |
| 3,649,843 | 3/1972 | Redwine et al. | 307/205 X |
| 3,735,277 | 5/1973 | Wanlass | 307/251 X |
| 3,736,522 | 5/1973 | Padgett | 307/251 X |
| 3,742,260 | 6/1973 | Boudry | 307/246 X |
| 3,764,823 | 10/1973 | Donofrio | 307/205 |
| 3,769,528 | 10/1973 | Chu | 307/270 |
| 3,774,055 | 11/1973 | Bapat | 307/251 X |
| R27,305 | 3/1972 | Polkinghorn et al. | 307/279 X |

*Primary Examiner*—Michael J. Lynch
*Assistant Examiner*—L. N. Anagnos
*Attorney, Agent, or Firm*—K. R. Bergum; D. L. Hurewitz; J. L. Landis

[57] ABSTRACT

A clock driven dynamic inverter produces high speed-low power signal inversion, with a high voltage output swing. Such operation is accomplished in one illustrative dynamic inverter embodiment with two specially phased clock driven switching MOSFETs, a dynamically driven load MOSFET, incorporating positive capacitive voltage feedback, and an input signal-responsive driver MOSFET.

5 Claims, 3 Drawing Figures

CLOCKED DYNAMIC INVERTER

BACKGROUND OF THE INVENTION

1. Field of the Invention

This invention relates to solid state logic circuitry and, more particularly, to integrated field-effect transistor circuits of the inverter, driver or gating types.

2. Description of the Prior Art

Integrated circuits of the inverter type, for example, have taken many different forms heretofore, but broadly fall into two basic categories, namely, static and dynamic. Static inverters generally are characterized by producing an output signal that is always a valid, timecoincident complementary representation of the applied input signal. This has normally necessitated a mode of operation heretofore wherein the load transistor is continuously operated during the period of time that a true input signal is applied to the circuit, thus dissipating d-c power 50 percent of the time in a typical mode of operation (hence, a 50 percent duty factor).

In order to conserve power, inverter circuits have often been designed heretofore to operate in the aforementioned dynamic mode, i.e., with an output that is not a valid time-coincident, complementary representation of the input signal. More specifically, in such circuits, an output voltage signal may be produced for a period of time either shorter or longer than that of the input data signal. In the case of a longer output period, a capacitive rather than resistive load is required to effect a stored charge transfer from the output of the inverter to associated circuitry.

In many of such logic circuits, the active devices are often of the metal-oxide-silicon field-effect transistor type, hereinafter generally referred to simply as "MOSFETs". The preference for such devices will become more apparent hereinbelow.

To effect a reduction in power dissipation when a MOSFET inverter circuit is operated in a dynamic mode, one or more properly phased clock generators are often employed to limit the d-c ON-time of the load MOSFET, as well as of certain other active switching devices of the circuit. To that end, clock generators have either been utilized as the main d-c power supplies of the circuit, or utilized to gate at least those active MOSFET devices that are d-c coupled to ground at any time during the operation of the circuit. It is readily appreciated, of course, that as the number of clock generators (as distinguished from static d-c sources) required in a give IC circuit increase, not only does this correspondingly increase circuit fabrication costs, but it poses additional internal and external interconnection and phasing problems.

From the foregoing, it becomes readily apparent that dynamically operated inverter circuitry is often quite complex, and generally requires more than four or more active clock driven IC devices, which encompass appreciable substrate surface area. Compounding the problem with respect to minimizing circuit chip size (or real estate), is the fact that the load and driver inverter devices, when of the MOSFET type, must be made large enough to effect rapid charging and discharging of the various desired storage and feedback capacitors associated therewith. Only in this way can relatively high output voltage swings and fast switching speeds, generally sought in most systems applications, be realized. Unfortunately, as the size of a MOSFET increases, particularly the width-to-length (W/1) dimensions of its channel, power dissipation, for given applied drain and gate voltages, increases and switching speed decreases. Thus, there is always a trade-off necessary in device size and voltage levels required in order to achieve a minimum speed-power product, often referred to as the figure of merit for MOSFET inverter circuits.

In order to gain a little deeper insight into the problems involved in minimizing the speed-power product (or figure of merit) of inverter circuits utilizing MOSFETs, for example, it would perhaps be beneficial at this point to provide some background into the nature and operating characteristics of such active devices. There are a number of significant reasons why MOSFETs are often preferred as the active devices in many IC logic circuits at the present time. More specifically, while MOSFETs heretofore have not exhibited the switching speeds realized with bi-polar transistors, for exammple, they do advantageously exhibit a very high input impedance, such as is realized with a solid state amplifier, and a transfer characteristic ($g_m$) similar to that exhibited by a pentode vacuum tube. By reason of their essentially two-dimensionall structural nature, MOSFETs also readily lend themselves to high volume manufacture in integrated or monolithic circuits.

Notwithstanding the many attributes of MOSFETs, when utilized as the active devices in medium or large scale integration (MSI or LSI) circuits, the size of each device and the power dissipated thereby become very important circuit design factors for a number of very significant reasons. First, it is readily apparent that as the size of a MOSFET is reduced, the packing density thereof on a given substrate or chip can be increased. Equally important, however, is the fact that bias voltage level requirements to a great extent dictate the minimal size of a MOSFET. Moreover, only by minimizing both of these interrelated parameters can power dissipation, stray capacitance and leakage current effects be decreased, and device yields be increased.

Considered more specifically, and with reference first to power dissipation, the d-c current through a given size MOSFET essentially varies as the square of the applied drain voltage. Stated another way, for a given device geometry and gate voltage, if the drain voltage is reduced by a factor or two, the power dissipated by a MOSFET operated in the nonsaturated region is reduced approximately by a factor of four. It thus becomes very important that the d-c supply voltage connected to the drain of an output or load MOSFET, in particular, be as short in duration and as low as possible, as such a device essentially functions as a variable series resistor connected between a voltage supply and ground. Accordingly, a load MOSFET, when typically drain-biased with a relatively high, common, multi-threshold compensating supply voltage, disadvantageously must necessarily be designed with relatively large dimensions, particularly with respect to the channel length (1) thereof, in order to limit the current that flows therethrough to within acceptable limits.

Another factor determinative of the d-c current flow through a MOSFET is the width-to-length (W/1) dimensions of the enhancement (or depletion) mode channel. More specifically, as the width (W) of the channel is made smaller, the d-c power dissipated is reduced for given applied drain and gate supply voltages.

Stray capacitance effects, both within and between MOSFETs, also vary directly with voltage-current requirements. Accordingly, packing density is also dependent to a great extent on device power requirements. The inherent two-dimensional nature of MOSFETs, of course, also make power-dependent thermal factors, as well as leakage current problems, of paramount inportance in the design of circuits and systems utilizing such devices.

With respect to product yield, it has been found to increase as the size of a MOSFET decreases. This is due primarily to the fact that as the required silicon gate oxide area increases, there is a corresponding increase in the probability of the occurrence of pin holes and/or pits therein, which defects result in internal shorts or leakage problems.

Inverter circuit switching speed or, more precisely, output signal transition speed, and the output voltage swing required in a given application are also important factors that partially dictate the minimum level of supply voltage(s) that can be utilized with a given MOSFET inverter. This is particularly true with respect to the gate control bias of the load functioning MOSFET(s). As is well known, the output voltage from a load operated MOSFET is less negative than the gate voltage thereof (using negative logic) by one threshold value of voltage. Inasmuch as many MOSFET inverters use at least two gate-coupled stages, the output from the last stage may be two or more thresholds lower than the supply voltage. Accordingly, such multiple threshold voltage drops have disadvantageously necessitated a higher supply voltage than desired in many multistage inverters heretofore in order to obtain not only an adequate output voltage swing, but a substantial gate-to-source voltage differential required to effect high speed output switching.

In accordance with one prior art solution to this problem, and particularly with respect to compensating for a two threshold voltage drop in a two stage MOSFET inverter of the static type, the output voltage is fed back from the source to the gate of the output or load device by means of a positive, capacitive voltage feedback loop. Such a feedback technique produces a "kicker" voltage that advantageously allows the gate voltage of the load MOSFET to periodically rise considerably above the drain supply voltage of the device. One such circuit is described in R. W. Polkinghorn et al. U.S. Pat. No. Re. 27,305, herein incorporated by reference. It should be appreciated, however, that in a multi-stage, single voltage source inverter, there still remains a necessity of having to utilize a common level of supply voltage sufficient to compensate for more than one threshold voltage drop.

A reduction in d-c power dissipation in the load and driver MOSFETs of a static inverter circuit has been further realized heretofore by a unique type of dual circuit biasing employed in conjunction with capacitive voltage feedback. More specifically, as disclosed in a commonly assigned, copending application of C. A. Feucht, Ser. No. 317,579, filed Dec. 22, 1972, now U.S. Pat. No. 3,845,324, issued Oct. 29, 1974 incorporated herein by reference, separate high and low voltage sources are employed for the a-c and d-c coupled portions of an inverter circuit, respectively, In this manner, the bias voltage applied to the drain electrode of the load MOSFET need only be as high as required for a desired output voltage swing, and completely independent of any threshold voltage drops of the circuit. Such a dual biasing technique in a static inverter circuit, however, still involves a d-c power dissipation period equal to the input signal period, hence, a 50 percent duty factor.

There thus has been an urgent need for a multistage, dynamically operated MOSFET inverter circuit of simplified design that minimizes power dissipation while simultaneously maximizing output signal transition speed. In other words, there has been a need for a dynamically operated inverter, driver or gating circuit that exhibits a minimum speed-power product, referred to as the figure of merit for such circuits. By minimizing not only the size of, but the level and duration of the biasing voltages applied to MOSFET devices, deleterious stray capacitance and current leakage effects both within a given device, and between adjacent devices, are substantially reduced. A reduction in device size also contributes to a substantial improvement in device yield because of smaller silicon gate oxide areas.

SUMMARY OF THE INVENTION

It is an object of the present invention to provide a new and improved dynamically operated, clock-controlled inverter circuit of simplified construction, and which produces substantially high level, high speed output voltage transitions with minimal power dissipation, so as to achieve a very low speed-power product, or high figure of merit.

In accordance with the principles of the present invention, the above and other objects are accomplished by utilizing in one illustrative dynamic inverter embodiment two clock driven switching MOSFETs, a periodically driven load MOSFET incorporating positive capacitive voltage feedback, and an input signal-responsive driver MOSFET. In one preferred embodiment, a built-in storage capacitance is effectively coupled to the gate electrode of the load MOSFET in such a way as to dynamically drive that device, independently of a gate supplied d-c bias, during a portion of the time in which the driver MOSFET is turned on and directly d-c coupled to ground. In this manner, the output signal produced in response to each input TRUE (logical "1") signal may be extended in time, with only a small increase in d-c power dissipation.

High output voltage swings and very rapid signal transitions are accomplished, in part, by utilizing a substantial overdriving gate-to-source voltage differential on the load MOSFET, made possible by capacitive voltage feedback. Minimal power dissipation is accomplished primarily by dynamically controlling the ON-time of the load MOSFET in a very unique manner. As such, both smaller load and driver MOSFETs may be employed not only to minimize power dissipation, but to increase device yields and circuit packing density, and at the same time effect reductions in stray capacitance and current leakage.

While the preferred embodiment of the invention is described herein in connection with MOSFETs of the p-channel enhancement mode type, it should be understood, of course, that the principles of the present invention apply equally well to circuits using p-channel depletion mode devices, as well as n-channel enhancement or depletion mode devices.

DETAILED DESCRIPTION OF THE INVENTION

Figures 1, 3:
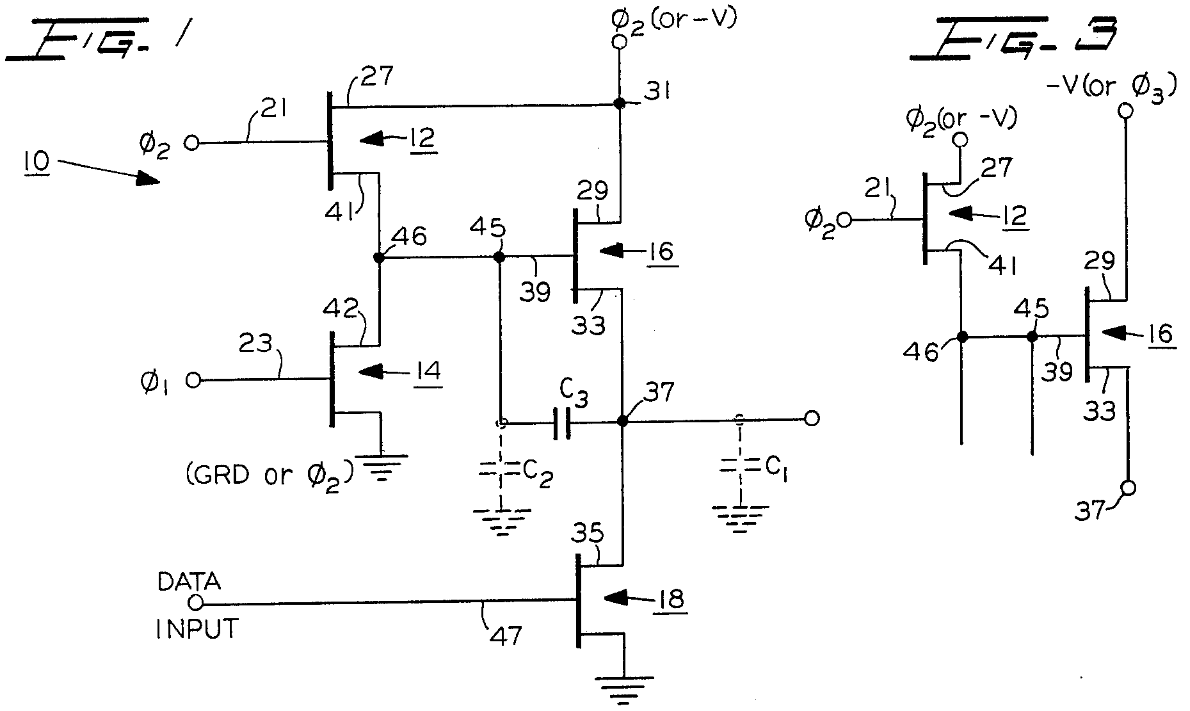
FIG. 1 is a schematic circuit diagram of a dynamically operated inverter circuit embodying the principles of the present invention.
FIG. 3 is a partial schematic circuit diagram of the inverter circuit of FIG. 1, utilizing a slightly different biasing arrangement.

Referring now in greater detail to one preferred illustrative embodiment of the invention as depicted in FIG. 1, an inverter circuit designated generally by the reference numeral 10 comprises four MOSFETs designated 12, 14, 16 and 18. MOSFETs 12 and 14 function as switching devices, whereas MOSFETs 16 and 18 function as resistive load and driver devices, respectively, of the inverter circuit. In the specific illustrative embodiment, these MOSFETs are preferably p-channel, enhancement mode devices, generally of the type described in R. H. Heeren et al. U.S. Pat. Nos. 3,618,050 and 3,631,465.

MOSFETs 12 and 14 are clock driven and sequentially operated, with a gate electrode 21 of the former and a gate electrode 23 of the latter being connected to $\phi_2$ and $\phi_1$ clock sources, respectively. A drain electrode 27 of the MOSFET 12 is connected to a drain electrode 29 of the load MOSFET 16 through a node 31, and biased by the clock source $\phi_2$ in one preferred embodiment, or by a continuous −V d-c power supply in an alternative embodiment. In still a further modification, as depicted in FIG. 3, it is often desirable to apply a separate −V (or $\phi_3$) bias voltage to only the drain electrode 29, and at a level as low as possible commensurate with the output voltage swing required for a particular application.

The significance of and reasons for selectively choosing between a $\phi_2$ clock source and a −V (or $\phi_3$) supply for biasing the drain electrode 29 of the load MOSFET 16 will become more apparent hereinafter in connection with a discussion of the typical operating waveforms depicted in FIG. 2.

The load MOSFET 16 has a source electrode 33 connected to a drain electrode 35 of the driver 18 through an output node 37. This node is typically associated with an output load capacitor, herein shown in phantom and identified as $C_1$. A gate electrode 39 of the MOSFET 16 is connected to a source electrode 41 of the MOSFET 12, as well as to a drain electrode 42 of the MOSFET 14, through nodes 45 and 46. A gate electrode 47 of the MOSFET 18 is connected to a data input source.

A capacitor $C_2$, shown in phantom, effectively connects the node 45 to ground. This capacitor is representative of the various inherent electrode-established capacitances, as well as other forms of stray capacitances, associated with the four MOSFETs, and is discussed further in the aforementioned Heeren patents. It should be noted at this point, however, that the capacitor $C_2$ serves a very necessary function in the present inverter circuit.

More specifically, the capacitor $C_2$ functions as a gate storage capacitor which allows the load MOSFET 16 to remain ON for a period of time after each $\phi_2$ clock pulse terminates. The absence of the latter pulse, of course, turns OFF the switching MOSFET 12 and, thereby, removes the $\phi_2$ or −V bias voltage otherwise applied through the switching MOSFET 12 to the gate electrode 39 of the load MOSFET 16. It, of course, is readily apparent that when the drain electrode 29 of the load MOSFET 16 is also periodically pulsed by the clock pulse $\phi_2$, the temporary charge stored on the capacitor $C_2$ has no effect on maintaining the load MOSFET 16 ON in the absence of $\phi_2$.

Also depicted in FIG. 1 is a positive feedback capacitor $C_3$ which is coupled between the output node 37 and the gate electrode-associated node 45. In practice, the capacitor $C_3$ is made considerably larger than the total capacitances represented by the capacitor $C_2$ so as to provide effective and substantially complete positive feedback of the output voltage. More specifically, with the load and driver MOSFETs 16 and 18 operating in their preferred, unsaturated regions, the output voltage at the source electrode 33 of the MOSFET 16 preferably swings from near ground or logical "0" (whenever the driver MOSFET 18 is ON) to the bias voltage level of $\phi 2$ (or −V or $\phi_3$), representative of a logical 1, whenever the MOSFET is OFF.

To accomplish this output voltage swing, as will be discussed in greater detail hereinbelow, the capacitor $C_3$ feeds back to the gate electrode of the load MOSFET 16 in a preferred mode of operation, an increment of voltage substantially equal to the level of the voltage applied to the drain electrode thereof. This feedback "kicker" voltage advantageously augments the clock pulse voltage $\phi_2$, which is periodically applied to the gate electrode 39 of the load MOSFET 16 through the switching MOSFET 12. More specifically, whenever the driver MOSFET 18 is OFF during the period of $\phi_2$, the combined MOSFET 16 gate voltage equals the level of $\phi_2$, less the threshold voltage drop of MOSFET 12, plus the "kick" voltage of a magnitude equal to the $\phi_2$ (−V or $\phi_3$) voltage applied to the drain electrode 29 of the MOSFET 16, times the ratio $$\left(\frac{C_2}{C_2 + C_3}\right).$$

The latter ratio reflects the voltage divider effect produced by the capacitors $C_2$ and $C_3$, with $C_3 >> C_2$.

It is thus seen that whenever the driver MOSFET 18 is OFF during the period of $\phi_2$, the combined gate voltages applied to the load MOSFET 16 produces a substantial overdriving gate-to-source voltage differential which significantly effects an increase in the signal output transition speed and, in particular, the negative going transition speed (i.e., in going from zero to $\phi_2$, −V or $\phi_3$) of that device over that realized without a feedback capacitor. This augmented gate voltage is best illustrated in FIG. 2*d* with respect to a $\phi_2$ clock source.

In this regard, it should be appreciated that the positive going transition time (i.e., in going from $\phi_2$, for example, to 0 in FIG. 2*d*), is normally considerably shorter than the negative counterpart, and is primarily controlled by the size of the driver MOSFET 18. As a matter of fact, the positive going transition time can generally be ignored in comparison to the negative counterpart in most MOSFET circuits. There are two basic reasons for this normally experienced disparity.

First, and with reference being made to the particular inverter circuits embodied in the present invention, the load MOSFET 16 necessarily exhibits a resistance that typically is ten or more times greater than the driver MOSFET 18. As such, for a given value of stray capacitance, the time constant for the load MOSFET 16 is naturally ten or more times greater than that of the driver MOSFET 18.

Secondly, in most inverter circuits, the gate-to-source driver bias remains essentially constant (at the level of the input signal) during switching, whereas the gate voltage applied to the load MOSFET 16 is effectively modulated by the output (source electrode) voltage in a manner that normally results in the gain of the load MOSFET being reduced inversely as the output voltage swing increases. It is these two factors, in particular, that have led to the deleterious transient effects experienced with load MOSFETs heretofore, and has resulted in MOSFET logic circuits generally being restricted to low frequency operation.

Significantly, however, in accordance with the principles of the present invention, the utilization of capacitive voltage feedback in the inverter circuits embodied herein produces a substantially higher effective, unmodulated, overdriving gate-to-source voltage differential on the load MOSFET 16 than could otherwise be realized. This increased gate voltage, which produces substantially increased signal switching response time, thus at least partially compensates for the normally experienced lower load versus driver MOSFET response time due to the typically higher resistance exhibited by the former.

In addition, the utilization of a bias voltage for the drain electrode 29 of the load MOSFET that is lower than the clock voltage $\phi_2$, as will presently be seen, has the advantage of reducing the degree of gate-to-source modulation induced in the latter device (by restricting the output voltage swing to the lower voltage level). As such, the gain of the load MOSFET 16, which varies inversely with the output voltage swing, need not be reduced nearly as much as in the case where the output voltage swing is made dependent solely on a higher voltage source, such as $\phi_2$, which necessarily must compensate for two threshold voltage drops, namely, those associated with MOSFETs 12 and 16.

Figure 2:
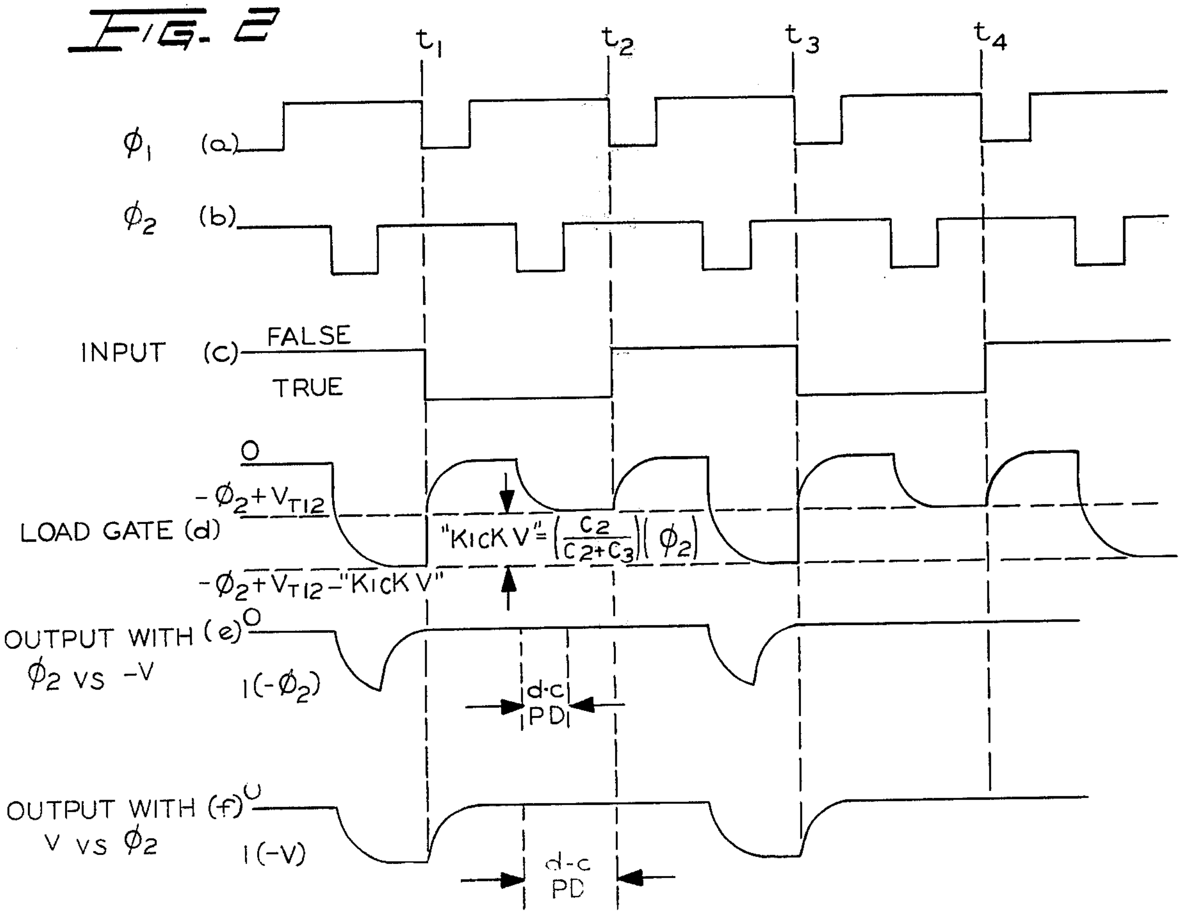
FIG. 2 shows a series of waveforms and, in particular, the relationship between the input and output signals relative to peculiarly phased and applied clock pulses involved in the dynamically operated inverter circuit of FIG. 1.

Attention will now be directed to a typical mode of operation for the dynamic inverter circuit of FIG. 1, with particular reference being made to the various waveforms depicted in FIG. 2. For reference purposes only, all relative signal levels herein will be based on standard "negative logic" used with P-channel, enhancement-mode devices, wherein the most negative input or output signal is defined as a logical 1, and the most positive (or ground) signal is a logical 0. As part of this logic nomenclature, a "FALSE" input signal is defined as the most positive (or zero) signal, and a "TRUE" input signal is defined as the most negative signal.

With particular reference now to both FIGS. 1 and 2, and starting at a time $t_1$, when a negative TRUE input data signal (FIG. 2c)is applied to the gate electrode 47 of the driver MOSFET 18, that device is turned ON. This establishes a ground-discharge path for the output node 37, through the MOSFET 18. As a result, the output signal (FIG. 2e or f) is pulled (or inverted) in going through a transition (turn-ON state), namely, from a previous $-\phi_2$ voltage level (representative of a logical 1) to a level at or near zero (representative of a logical 0).

In accordance with the dynamic mode of operation employed in the present inverter circuits, the two switching MOSFETs 12 and 14, and the load MOSFET 16 are only ON for short selective clock periods during each input data signal period. More specifically, it can be seen from FIG. 2a, that each clock pulse $\phi_1$ starts at the beginning of each input data signal period, but encompasses only one fourth of the latter period, such as between $t_1$ and $t_2$. During each $\phi_1$ clock period, the switching MOSFET 14 is turned ON, and thereby provides a direct path from the node 45 to ground (or to the quiescent level of the $\phi_2$ clock source in an alternative arrangement), so as to discharge the capacitor $C_2$, which was previously charged during the $\phi_2$ clock pulse period, as well as any charge still remaining on the feedback capacitor $C_3$, provided the driver MOSFET 18 is then ON. The manner in which the capacitors $C_2$ and $C_3$ are periodically and selectively charged will be described in greater detail hereinbelow.

With reference to FIG. 2b, it is seen that a $\phi_2$ clock pulse occurs one clock pulse period after a $\phi_1$ clock pulse during each input signal period, such as between the times $t_1$ and $t_2$. Each $\phi_2$ clock pulse is applied to the gate and drain electrodes 21 and 27, respectively, of the switching MOSFET 12 and turns that MOSFET ON. As such, a bias voltage is applied through the node 45 to the gate electrode 39 of the load MOSFET 16 and likewise turns that device ON, as the drain electrode 29 of the load MOSFET is also biased at that time by the $\phi_2$ clock pulse in the one of severall preferred illustrative embodiments now being considered. During this period of time, the capacitor $C_2$ is charged sufficiently to establish an independent transient bias voltage on the gate electrode 39 of the load MOSFET 16 after the clock pulse $\phi_2$ terminates.

However, notwithstanding the nature of the bias voltage applied to the gate electrode 39, when the input signal applied to the gate electrode 47 of the driver MOSFET 18 is TRUE, as in the illustrative time period between $t_1$, and $t_2$, the source electrode 33 of the load MOSFET 16 remains directly coupled to ground through the driver MOSFET 18. This has the effect of maintaining the output node 37 at ground (a logical 0) potential, even during the $\phi_2$ clock period, until the driver MOSFET 18 is turned OFF. This is best seen by the output waveform depicted in FIG. 2e.

Upon the removal of the $\phi_2$ clock pulse from the gate and drain electrodes 21 and 27, respectively, of the switching MOSFET 12, that device is turned OFF. As previously noted, the charge then stored on the capacitor $C_2$ is sufficient to produce a continued turn-ON bias voltage on the gate electrode 39 of the load MOSFET 16 until the next $\phi_1$ clock pulse (at $t_2$). Whether the load MOSFET 16 remains ON during this period depends on whether a bias potential differential then exists between the drain and source electrodes thereof. In any event, when the drain electrode 29 of the load MOSFET 16 is biased by $\phi_2$, d-c power is advantageously dissipated only during the period of the $\phi_2$ clock pulse, which period is indicated between the two dashed lines located beneath the output waveform in FIG. 2e.

At time $t_2$, it is seen in FIG. 2c that a FALSE (or zero level) input signal is applied to the gate electrode 47 of the driver MOSFET 18, and turns that device OFF.

This effectively isolates the output node 37 from ground (or some other more positive reference level). However, the output does not change at this time because a $\phi_1$ clock pulse is then again applied to the gate electrode 23 of the switching MOSFET 14 and turns it ON. As previously mentioned, this provides a direct path from the node 45 to ground (or to the quiescent level of the $\phi_2$ clock source) so as to again discharge the previously stored charge on the capacitor $C_2$, as well as any charge that might otherwise still remain on the feedback capacitor $C_3$. As such, it is seen that during a FALSE input signal period, such as between $t_2$ and $t_3$ in FIG. 2, there is a quiescent operating period defined between the termination of the $\phi_1$ clock pulse and the beginning of the related $\phi_2$ clock pulse when none of the four MOSFETs of the inverter circuits is ON. Considered another way, upon the discharging of the capacitors $C_2$ and $C_3$, this effectively removes any possible gate voltage from the load MOSFET 16 and, thereby, prevents that device from turning ON, regardless of the nature of the input signal, and regardless whether a continuous (static) d-c voltage supply, such as −V, $\phi_2$ or a third clock source $\phi_3$ were employed to bias the drain electrode 29. It is thus seen that the output node 37 will remain at zero potential under all the foregoing possible operating conditions from the time of $t_2$ until a $\phi_2$ clock pulse is again applied to the gate electrode 21 of the switching MOSFET 12.

At such a time, and when a FALSE input signal is present, such as between the times $t_2$ and $t_3$, the output node 37 and, hence, the output signal, rapidly swings negative (as depicted in FIG. 2e) toward the level of $-\phi_2$ (or −V or $\phi_3$), the logical 1 state, as a result of the load MOSFET 16 being turned ON. This negative output, when derived from a $\phi_2$ clock pulse applied to the drain electrode 29, is of relatively short duration, essentially encompassing only the $\phi_2$ clock period. For most circuit and system applications, however, this short logical 1 negative output time period depicted in FIG. 2*e* is more than adequate to drive or otherwise control associated devices and/or circuitry. As will be discussed in greater detail hereinafter, it can also be seen in FIG. 2*d* that a superimposed KICK voltage is fed back by the capacitor $C_3$ to the gate electrode 39 of the load MOSFET.

In the alternative biasing arrangement wherein a continuous −V d-c source is employed rather than $\phi_2$ clock pulses to bias the drain electrode 29 of the load MOSFET 16, each negative output signal would encompass not only the $\phi_2$ period, but that period of time thereafter that elapses until the next succeeding $\phi_1$ clock pulse period, such as at time $t_3$, for example. This longer negative output period, defined as the d-c PD (Power Dissipated) period between the dashed lines located beneath thc waveform in FIG. 2*f*, is made possible, as previously described, by reason of the capacitor $C_2$ being periodically charged during each $\phi_2$ clock pulse period. Such capacitor charging is sufficient to establish a transient bias voltage on the gate electrode 39 of the load MOSFET 16 that is capable of maintaining that device ON during the extended period in question.

The primary disadvantage of using a continuous −V d-c supply rather than the $\phi_2$ clock source to bias the drain electrode 29 of the load MOSFET is thus seen to be the higher percentage duty factor, or longer d-c power dissipation period involved in the operation of the inverter circuit. Notwithstanding this fact, there is an advantage realized in certain applications by using a separate −V supply, but in a very special way. More specifically, as disclosed and claimed in the aforementioned copending application of C. H. Feucht, circuit power dissipation may be significantly reduced in inverter circuits, for example, by making the output voltage swing dependent on, and controlled by, a minimum level of voltage applied to the drain electrode 29 of the load MOSFET 16, which level is determined primarily by the output voltage swing required in a given application. This minimum drain voltage advantageously may be considerably less than the level of voltage required for the drain electrode 27 of the switching MOSFET 12, because of the threshold drop encountered in not only that device, but the load MOSFET as well.

This may perhaps be most readily appreciated by now examining one preferred dynamic mode of operation for the inverter circuit embodied herein, wherein the level of the bias voltage applied to the drain electrode 29 of the load MOSFET limits the output voltage swing. For this purpose, representative values have been chosen for the clock source pulses, d-c supply source, and threshold voltage drops for certain of the devices. Let it be assumed that the $\phi_2$ clock pulses are at a level of −12 volts, −V = −4 volts, and the threshold drops of the MOSFETs 12 and 16 equal 4 and 3 volts, respectively. Under these operting conditions, it is seen that the periodic clock pulse voltage applied to the gate electrode 39 of the load MOSFET 16 will equal $-\phi_2$, less $V_{T12}$, or $-12 + 4 = -8$ volts. Without considering the effect of capacitive feedback for the moment, and if −V was equal to $-\phi_2$, the static output voltage swing would then simply equal the difference between approximately zero (in the typical case) and $-\phi_2 + V_{T12} + V_{T16}$, or −5 volts. However, with the drain electrode 29 of the load MOSFET biased at $<-\phi_2$, the output cannot rise above that lower level, namely, −4 volts in the illustrative example. This follows from the fact that the maximum attainable source electrode voltage in a MOSFET is always limited not only by the gate electrode voltage, less the threshold voltage drop of the device, but by the magnitude of the drain electrode voltage.

Nevertheless, and very significantly, with capacitive voltage feedback, $C_3$ periodically feeds back to the gate electrode 39 a magnitude of voltage substantially equal to −V in the illustrative example under consideration, even if the above-defined periodic output voltage swing due to $-\phi_2$ alone would be less than −V.

Considered more specifically, the periodic output voltage swing due only to $\phi_2$ in being equal to −5 volts, is −1 volt more negative than −V. Accordingly, it is seen that by utilizing a −V d-c bias lower than $-\phi_2$, as in FIG. 3, for the drain electrode 29 of the load MOSFET, the former not only determines the upper established limit of the output voltage swing for the mode of operaton in question, but also determines the magnitude of the kicker voltage fed back to the gate electrode 39 of the MOSFET 16. (see FIG. 2d).

As such, it becomes readily apparent that the gate electrode 39 is periodically biased (during each input FALSE signal period) to a combined voltage of: $|-\phi_2 + V_{T12}| + |-V|$ or $|-12 + 4| + |-4| = -12$ volts. In this example, it is assumed, of course, that the value of capacitance of $C_3$ is much greater than that of $C_2$, and that $$\left(\frac{C_2}{C_2 + C_3}\right) \times (-V) \approx -V.$$

This combined voltage provides a substantial overdriving gate-to-source voltage differential over that realized without capacitive feedback, even though the output voltage cannot become more negative than the drain electrode bias of −V (−4 volts) in the illustrative example. It is this periodic increase in gate voltage, as will be discussed further hereinafter, that reflects a substantial improvement in output switching speed.

With respect to the load MOSFET 16, it should be fully appreciated that not only a static −V d-c supply, but a third clock source, such as $\phi_3$ indicated in FIG. 3, operated at a voltage level equal to or less than $-\phi_2$, could be employed to independently bias the drain electrode 29 and thereby determine the output voltage swing. In the case of a third clock source, such bias could be applied not only during that period of time encompassed by $\phi_2$, but for any additional period of time thereafter until the start of a new input data signal period. In this manner, the duty factor (and power dissipated) could be increased as required for a particular application within a range that could vary between the d-c-PO limits indicated in FIG. 2*f*.

From the foregoing, it can be readily appreciated that whether the d-c power dissipation period encompasses the time of one clock pulse ($\phi_2$), as in FIG. 2*e*, or two clock pulse periods, as in FIG. 2*f*, or some period therebetween under the control of a $\phi_3$ clock source, the duty factor is considerably smaller than the 50 percent duty factor experienced in static inverters, i.e., inverters where the load MOSFET is ON during the entire period encompassed by a TRUE input data signal. As such, the dynamically operated inverter circuits embodied herein substantially minimize d-c power dissipation over not only static inverters, but many other types of dynamic inverters necessitating higher percentage duty factors and/or multiple clock sources periodically coupled to ground. For further details of the advantages derived in using a bias voltage on the drain electrode 29 of the load MOSFET which is lower than the operating voltage applied to the gate electrode thereof, reference is made to the aforementioned Feucht application.

Considering the switching speed characteristics of the present inverter circuit, now in greater detail it will be recalled that it is the feedback capacitor $C_3$ that advantageously makes it possible for the output signal to swing not only all the way to the level of the bias voltage applied to the drain electrode 29 of the load MOSFET 16, be it $\phi_2$, −V or $\phi_3$, but to do it quite rapidly. Stated another way, it is the periodic, supplemental feedback kicker voltage depicted in FIG. 2d that constitutes the primary reason for the present dynamic inverter circuit effecting very fast output signal transitions.

Considering the importance of the feedback capacitor $C_3$ further, if it were not utilized, the bias voltage on the gate electrode 39 of the load MOSFET 16 could never exceed the level of $-\phi_2$, less the threshold drop of the switching MOSFET 12. As such, if the level of $-\phi_2$, for purposes of illustration, were chosen to just equal the combined threshold voltage drops of the switching and load MOSFETs 12 and 16 (which sets the minimum level for $-\phi_2$ in order to maintain the load MOSFET 16 ON), it is seen that the maximum possible gate-to-source voltage differential for the load MOSFET 16 would then simply equal the threshold voltage of that device. This would be true whether the value of the voltage applied to the drain electrode 29 of the load MOSFET 16 was lower than or even equal to the level of $\phi_2$.

More importantly, however, such a minimum level for $-\phi_2$ would be impractical as it would not result in any useable logical 1 output signal being produced. A theoretical minimum clock voltage level for $-\phi_2$, with or without capacitive feedback, may therefore be expressed by the following voltage relationship: $|-\phi_2 + V_{T12}| = |-V_{T16}|$.

From a practical operating standpoint, however, the value of $-\phi_2$ alone, or in combination with capacitve feedback, must always produce a voltage on the gate electrode 39 of the load MOSFET 16 which is sufficient to offset the threshold drop of that device, and still produce a dynamic source electrode voltage sufficient to directly or indirectly establish a useable logical 1 output signal. This operating requirement, in accordance with the principles of the present invention, may be effected by utilizing either the $-\phi_2$ clock source, a static −V d-c supply, or a separate $\phi_3$ clock source to bias the drain electrode 29 of the load MOSFET and, thereby, control the magnitude and duration of the output voltage swing in a unique, dynamic, power conserving manner.

In summary, a uniquely simplified, reliable and inexpensive dynamic inverter circuit has been described which substantially minimizes d-c power dissipation when compared with not only static inverter circuits, but many other dynamic circuits as well, while also exhibiting relatively fast output switching response characteristics. As d-c power dissipation is minimized, the MOSFET devices and, in particular, the load and driver MOSFETs, may be reduced in size. This, of course, contributes to the present dynamic circuit also effecting increases in input impedance, in input-output isolation, and in product yields (because of smaller gate oxide areas), as well as reductions in stray capacitance and leakage current. Minimizing device size also advantageously allows an increase in packing density, which is so very important in MSI and LSI circuitry.

While specific embodiments and examples of the present invention have been described in detail, it will be obvious to one skilled in the art that various modifications may be made and alternatives provided without departing from the spirit and scope of the present invention. For example, with respect to possible variations in certain of the inverter circuit devices, it shoudl be apparent that the switching MOSFETs 12 and 14 could comprise any type of high resistance biasing device or circuitry capable of producing the requisite periodic MOSFET 16 gate voltage, and without allowing appreciable leakage current therethrough. This could be accomplished, for example, through the utilization of a discrete or solid state diode that could be dimensioned and polarized so as to be turned ON and clamp the gate electrode 39 at $-\phi_2$, for example, plus the diode forward voltage drop ($V_{DF}$), whenever the input signal is TRUE, and turned OFF whenever the input signal is FALSE (resulting in the gate electrode swinging more negative because of capacitive feedback).

Similarly, it should be appreciated that the driver MOSFET 18 may comprise any other device or circuit that is voltage-responsive, for example, and capable of selectively establishing either an essentially short circuit or an open circuit condition along a path defined between the output node 37 and ground (or equivalent thereof). It also is apparent in circuits of the type embodied herein that ground may be at a potential other than zero, such as in the case where the circuit substrate is biased to operate with a so-called floating ground.

What is claimed is:

1. A dynamic logic circuit having input and output terminals and comprising:

an input data signal source;

first voltage-responsive switching means having first and second terminals with a variable resistive path defined therebetween, and an actuable control terminal connected to said data source, said terminal, in response to different data signal levels, selectively switching said path from a first state exhibiting a relatively high value of resistance to a second state exhibiting a relatively low value of resistance, said first terminal being connected to the output terminal, said second terminal being connected to a circuit ground return, and said control terminal being connected to the input terminal;

a field-effect load transistor having source, drain and gate electrodes, said drain electrode being adapted for biasing at a predetermined voltage level and said source electrode being connected to the first terminal of said first switching means and to the output terminal;

a first clock pulse source for producing a first train of pulses at a first predetermined voltage level and repetition rate;

a bias voltage source;

second voltage-responsive switching means connected between said first clock source and said gate electrode of said load transistor, said second switching means, in response to each first clock source pulse applied thereto, establishing a relatively low resistance path therethrough, and supplying from said bias voltage source a periodic turnON bias voltage level on said gate electrode of said load transistor;

capacitor means connected between said source electrode and said gate electrode of said load transistor, said capacitor means feeding back to the gate electrode of said load transistor at least a portion of the output signal established during each successive period in which a pulse from said first clock source occurs while said first switching means is in said first high resistance state, said feedback voltage being sufficient, when combined with the voltage supplied periodically by said second switching means in response to each successive pulse from said first clock source applied thereto, to produce a substantial overdriving gate-to-source electrode voltage differential so as to produce a rapid output signal transition in the direction toward and reaching the level of the voltage applied to the drain electrode of said load transistor;

a second clock source for producing a second train of pulses in a sequential manner with said first train;

third voltage-responsive switching means having first and second terminals with a variable resistive path defined therebetween, and an actuable control terminal for selectively switching said path from a first state exhibiting a relatively high value of resistance to a second state exhibiting a relatively low value of resistance, said first terminal being connected to said gate electrode of said load transistor, said second terminal being connected to a predetermined ground return potential, and said control terminal being connected to said second clock source, the repetition rate of said pulses from said first and second clock sources being further correlated with the rate at which input data signals are applied to said input terminal, and a predetermined value of storage capacitance coupled to said gate electrode of said load transistor said value of storage capacitance being much smaller than the capacitance of said feedback capacitor means, said storage capacitance being periodically charged by pulsed turn-ON bias voltage applied thereto through said second switching means interconnection and, thereafter, temporarily providing a transient bias voltage on said gate electrode after each pulsed bias voltage from said first clock source has terminated.

2. A dynamic logic circuit in accordance with claim 1 wherein siad drain electrode of said load transistor is connected to a d-c bias source having a voltage level lower than the periodic turnON bias voltage level of said bias voltage source.

3. A dynamic logic circuit in accordance with claim 2 wherein said second switching means comprises a MOSFET having a gate, a drain, and a source electrode, and wherein at least the gate electrode thereof is connected to said first clock source, wherein said associated source electrode is connected to both the gate electrode of said load transistor and said third switching means, and wherein said associated drain electrode is connected to said bias voltage source.

4. A dynamic inverter circuit having data signal input and output terminals comprising:

a first clock pulse source for producing a first train of pulses at a first predetermined voltage level and repetition rate;

a first field-effect transistor having first and second electrodes and gate electrode, with at least said gate electrode being connected to said first clock source, and said first electrode being biased at least during the duration of each first clock source pulse at a predetermined voltage level;

a second field-effect transistor having first and second electrodes and gate electrode, the first electrode being biased at least during the duration of each first clock source pulse at a predetermined voltage level, and the gate electrode thereof being connected to the second electrode of said first transistor;

a third input signal responsive field-effect transistor having first and second electrodes and a gate electrode, with said first electrode thereof being connected to the second electrode of said second transistor and to said output terminal, said gate electrode of said third transistor being connected to said data signal input terminal;

a second clock source for producing a second train of voltage pulses in a sequential manner with said first train;

a fourth field-effect transistor having first and second electrodes and a gate electrode, the first electrode being connected to said second electrode of said first transistor and to said gate electrode of said second transistor, said second electrode of said fourth transistor being connected to a circuit ground return, and said gate electrode thereof being connected to said second clock pulse source which is operated sequentially with respect to said first clock source, and with said first and second clock sources being further correlated with the input signal rate, and a predetermined value of storage capacitance coupled to said gate electrode of said second transistor, said capacitance being periodically charged each time a pulse from said first clock source produces a bias voltage on said gate electrode of said second transistor, and after each of said clock pulse terminates, said charged capacitance producing a transient bias voltage capable of temporarily maintaining said second transistor ON; and feedback means connected between said drain electrode and said gate electrode of said second transistor, said feedback means comprising a capacitor having a value of capacitance substantially larger than said value of capacitance coupled to at least the gate electrode of said second transistor, said feedback capacitor feeding back to said gate electrode at least a portion of the output signal established during each successive period in which a pulse from said first clock source occurs while said third transistor is OFF, said feedback voltage thereby contributing to the establishment of a substantial overdriving gate-to-source electrode voltage differential so as to produce a rapid output signal transition in the direction toward and reaching the level of the voltage applied to the drain electrode of said second transistor.

5. A dynamic inverter circuit in accordance with claim 4 wherein said first, second, third and fourth transistors comprise metal-oxide-silicon-field-effect transistors, and wherein said first electrode and the gate electrode of said first transistor, and said first electrode of said second transistor, are all connected to said first clock source.

* * * * *